United States Patent
Chen et al.

(10) Patent No.: US 9,584,089 B2
(45) Date of Patent: Feb. 28, 2017

(54) NESTED MULTI-STAGE POLYPHASE FILTER

(71) Applicant: VIASAT, INC., Carlsbad, CA (US)

(72) Inventors: Qiang Richard Chen, Phoenix, AZ (US); Michael R Lyons, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 157 days.

(21) Appl. No.: 14/546,702

(22) Filed: Nov. 18, 2014

(65) Prior Publication Data

US 2015/0137910 A1    May 21, 2015

Related U.S. Application Data

(60) Provisional application No. 61/905,595, filed on Nov. 18, 2013.

(51) Int. Cl.
| | | |
|---|---|---|
| *H03H 7/06* | (2006.01) | |
| *H03H 7/01* | (2006.01) | |
| *H03H 17/02* | (2006.01) | |

(52) U.S. Cl.
CPC ............ *H03H 7/0123* (2013.01); *H03H 7/06* (2013.01); *H03H 17/0273* (2013.01)

(58) Field of Classification Search
CPC ...... H03H 7/0115; H03H 7/17; H03H 7/0138; H03H 7/06; H03H 7/0123; H03H 17/0273

USPC .......................... 333/172, 186, 204, 205, 168
See application file for complete search history.

(56) References Cited

U.S. PATENT DOCUMENTS

| | | |
|---|---|---|
| 7,190,942 B1 | 3/2007 | Nise |
| 7,405,636 B2 | 7/2008 | Ozasa et al. |
| 8,497,747 B1 * | 7/2013 | Wojciechowski ... H03H 9/0095 310/366 |
| 2001/0024150 A1 * | 9/2001 | Iio ............................ H01P 1/16 333/202 |

OTHER PUBLICATIONS

Georgia Institute of Technology, "Integrated Circuit Continuous Time Filters", Course ECE6414—Analog Circuits and Systems Design, Jan. 31, 2002, available at http://users.ece.gatech.edu/phasler/Courses/ECE6414/Unit3/CT_ICfilters.pdf, 137 pgs.
Lindberg, "Radio Frequency Integrated Circuits for 24 GHz Radar Applications", Doctoral Dissertation, Faculty of Science and Technology, Uppsala University, Dec. 2005, 90 pgs.

* cited by examiner

*Primary Examiner* — Stephen E Jones
*Assistant Examiner* — Rakesh Patel
(74) *Attorney, Agent, or Firm* — Snell & Wilmer L.L.P.

(57) ABSTRACT

A nested multi-stage polyphase filter can comprise: a first filter stage and a second filter stage. The first filter stage can be connected to the second filter stage via first through fourth intermediate connections. The first filter stage and the second filter stage can be laid out in a nested-ring layout. The first through fourth intermediate connections can be laid out so as to not cross over each other.

20 Claims, 12 Drawing Sheets

NESTED MULTI-STAGE POLYPHASE FILTER

PRIORITY CLAIM

This application claims priority to U.S. provisional patent application Ser. No. 61/905,595 filed on Nov. 18, 2013 and entitled "Nested Multi-Stage Polyphase Filter", the disclosure of which is incorporated herein in its entirety for all purposes.

FIELD

The present disclosure relates generally to radio frequency (RF) filters, and specifically to multi-stage polyphase filters.

BACKGROUND

Polyphase filters can be used to provide a filtered output signal with both balanced phase and balanced amplitude outputs. In one example, a polyphase filter can provide four amplitude balanced outputs with the phases 90° apart (e.g., 0°, 90°, 180°, 270°). Various such filter devices have been designed. One type of polyphase filter design involves planar circuit implementations, such as those used in the integrated circuit (IC) and printed circuit board (PCB) industries. In these embodiments, the designs typically involve intricate, complex connection lines between stages of multi-stage polyphase filters. These designs can be complex due to attempts to balance the phase and amplitude of the outputs of the filter. Unfortunately, these solutions can be expensive and complicated—often involving more than two layers and having unwanted coupling between the signals of the various connection lines. Even at great expense, these attempts may not provide satisfactory amplitude and phase balance, and can be particularly unsatisfactory at high frequency bands. Thus, new and useful devices for improving polyphase filters are now described.

SUMMARY

In an example embodiment, a nested multi-stage polyphase filter can include a first filter stage and a second filter stage. The first filter stage can be connected to the second filter stage via: a first intermediate connection, a second intermediate connection, a third intermediate connection, and a fourth intermediate connection. The first filter stage and the second filter stage can be laid out in a nested-ring layout. In an example embodiment, the first intermediate connection, the second intermediate connection, the third intermediate connection, and the fourth intermediate connection do not cross over each other.

In another example, a nested multi-stage polyphase filter can include: center connection ports, having a first center connection port and a second center connection port; intermediate connections, having a first intermediate connection, a second intermediate connection, a third intermediate connection, and a fourth intermediate connection; and outer connection ports, having a first outer connection port, a second outer connection port, a third outer connection port, and a fourth outer connection port. The filter can further include: a first filter stage, wherein the first filter stage can be configured in a ring and located between the center connection ports and the intermediate connections; and a second filter stage, wherein the second filter stage can be configured in a ring and located between the intermediate connections and the outer connection ports. Either (i) the center connection ports can be input ports and the outer connection ports can be output ports; or (ii) the center connection ports can be output ports and the outer connection ports can be input ports. The nested multi-stage polyphase filter can have more than one line of symmetry.

BRIEF DESCRIPTION OF THE DRAWING FIGURES

Within the accompanying figures, like numerals designate like elements, and:

DETAILED DESCRIPTION

Figure 1:
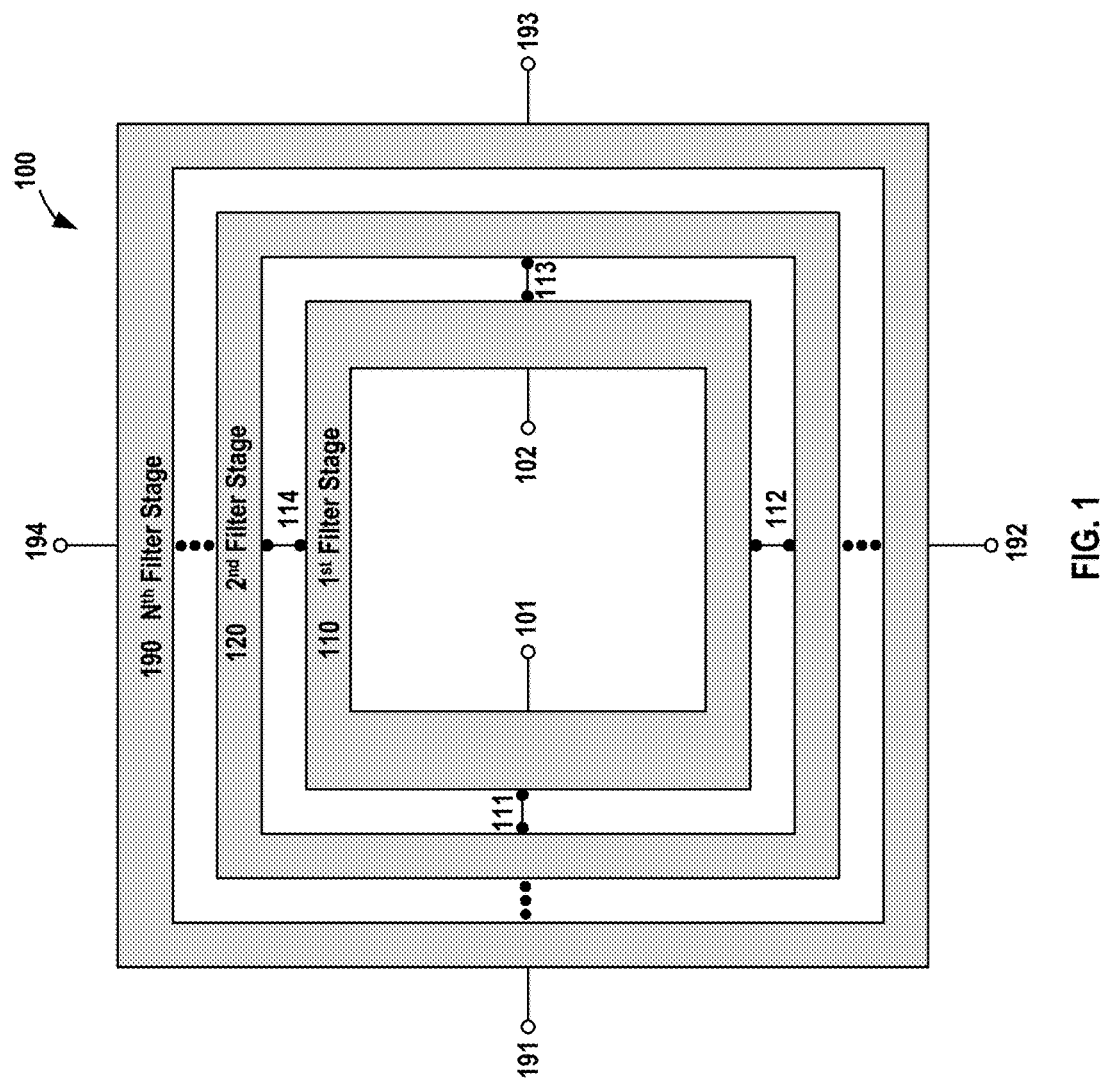
FIG. 1 is a block diagram of an example nested multi-stage polyphase filter.

Reference will now be made to the example embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In accordance with an example embodiment, a nested multi-stage polyphase filter can include a first filter stage and a second filter stage. The first filter stage and the second filter stage can be laid out in a nested-ring layout. In one example embodiment, the first filter stage can be connected to the second filter stage via intermediate connections. In various example embodiments, the intermediate connections can be laid out such that they do not cross-over each other or other intermediate connections. In some embodiments, the intermediate connections can be all located in a single layer of a semiconductor substrate. Moreover, the nested multi-stage polyphase filter can include symmetry relative to the filter's outputs and intermediate connections. In various embodiments, the nested multi-stage polyphase filter can include additional stages. In various embodiments, the nested multi-stage polyphase filter can include additional connections between the stages.

Figure 2:
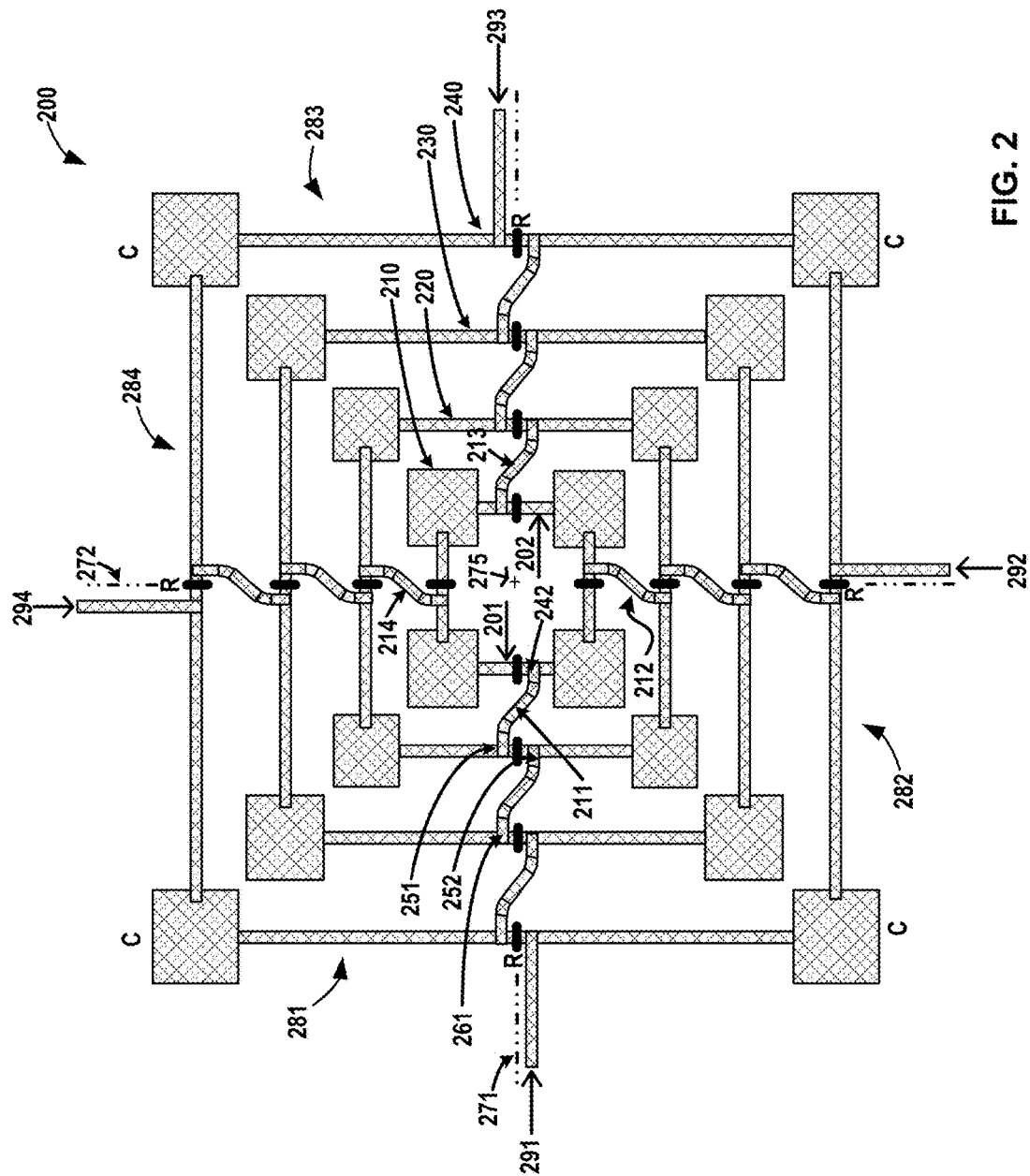
FIG. 2 is a schematic diagram of an example nested multi-stage polyphase filter.

With reference now to FIGS. 1 and 2, in an example embodiment, a nested multi-stage polyphase filter (100, 200) can include a first filter stage (110, 210) and a second filter stage (120, 220). In various embodiments, nested multi-stage polyphase filter 100 can include at least two stages. Stated another way, nested multi-stage polyphase filter 100 can include more than one stage. For example, nested multi-stage polyphase filter 100 can include 2-10 stages, more likely 2-8 stages, and most likely 2-6 stages. For example, nested multi-stage polyphase filter 100 can include 2, 3, 4, 5 or 6 stages. Thus, with reference to FIG. 2, nested multi-stage polyphase filter 200 can include a third stage (penultimate stage) 230, and a fourth stage (ultimate stage) 240. Moreover, any suitable number of stages can be used according to the principles disclosed herein. For example, nested multi-stage polyphase filter 100 can include N stages, where N can be an integer greater than 1. Thus, with reference to FIGS. 1 and 2, nested multi-stage polyphase filter (100, 200) can include an Nth, or ultimate, stage (190, 240).

In an example embodiment, first filter stage 110 and second filter stage 120 can be laid out in a nested-ring layout. In an example embodiment, a nested-ring design can be a layout with one filter stage entirely encircled by another filter stage. For example, first filter stage 110 can be "nested" inside second filter stage 120. Described another way, in an example embodiment, each stage in nested multi-stage polyphase filter 100 can be arranged in a ring, with a 'ring-within-a-ring' configuration. In various example embodiments, each ring can include a filter stage. In various example embodiments, the filter stages radiate out from a center of nested multi-stage filter 100 in the order of their connection to each other. In these example embodiments, first filter stage 110 can be the closest to the center, second filter stage 120 can be the next most outer stage from first filter stage 110, and Nth filter stage 190 can be the outermost filter stage from the center. In another example embodiment, and with momentary reference to FIG. 7, the filter stages can be in opposite order with the first filter stage being the outermost filter stage and the Nth filter stage being the innermost filter stage.

Figure 13:
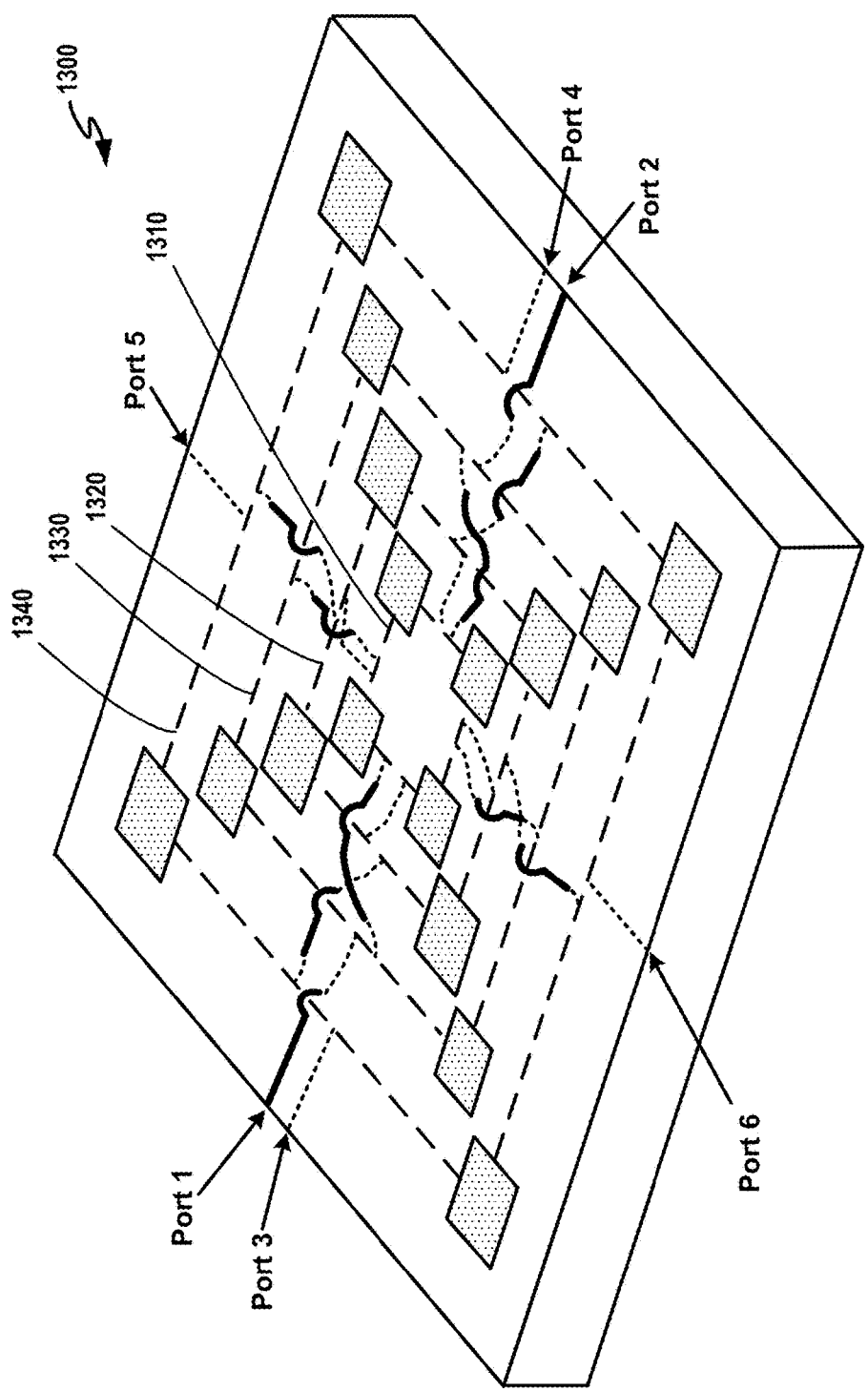
FIG. 13 is an isometric representative diagram of an example nested multi-stage polyphase filter having an out-of-order stage sequence from the middle to the outer rings.

Although described herein principally in connection with sequential stages progressing from the center stage of the nested multi-stage polyphase filter to the outside stage, in various example embodiments, the stages can be laid out in other orders. For example, the stages can progress from the center as stage 1, 3, 2, and then 4. In various other example embodiments, such a configuration can introduce out of plane cross-overs and intermediate connection line lengths. Nevertheless, such is also within the scope of this disclosure. In this regard, with momentary reference to FIG. 13, an example nested multi-stage polyphase filter 1300 can have nested stages connected out of a progressive radial order. For example, the input(s) can be connected to a stage 1 (1330), the third ring from the center of filter 1300. Stage 1 (1330) can be connected to stage 2 (1310), the first ring nearest the center. Stage 2 (1310) can be connected to stage 3 (1320), the second ring from the center. Stage 3 (1320) can be connected to stage 4 (1340), the outer most ring from the center. In this example embodiment, at least portions of the connections are out of the plane of the filter stages. For example, portions of the input connection, first to second stage connection, and third to fourth stage connection can be above the plane of the filter stages. In this example embodiment, the connections between stages can be crossing each other, but can also be configured with symmetry in the manner of their crossings, as discussed further herein.

Center and Outer Connection Ports

In an example embodiment, and with continued reference to FIGS. 1 and 2, nested multi-stage polyphase filter (100, 200) includes a first center connection port (101, 201) and a second center connection port (102, 202). First and second center connection ports (101/201, 102/202) can be connected to the first filter stage (110, 210). In an example embodiment, first and second center connection ports (101, 102) can be connected to first filter stage 110 from the interior of first filter stage 110. Stated another way, first and second center connection ports (101, 102) can be connected to first filter stage 110 from a center portion of nested multi-stage polyphase filter 100.

In another example embodiment, nested multi-stage polyphase filter (100, 200) includes a first outer connection port (191, 291), a second outer connection port (192, 292), a third outer connection port (193, 293), and a fourth outer connection port (194, 294). First, second, third and fourth outer connection ports (191, 192, 193, 194) can be connected to the Nth filter stage 190. In an example embodiment, first, second, third, and fourth outer connection ports (191, 192, 193, 194) can be connected to Nth filter stage 190 from the exterior of Nth filter stage 190. Stated another way, first, second, third, and fourth outer connection ports (191, 192, 193, 194) can be connected to an outer filter stage from a location outside of nested multi-stage polyphase filter 100. In one example embodiment, having two stages, where N=2, first, second, third, and fourth outer connection ports (191, 192, 193, 194) can be connected to second filter stage 120.

In one example embodiment, the center connection ports can be input ports and the outer connection ports can be output ports. For example, the center connection ports can be configured to receive microwave signals at first and second inner connection ports (101, 102), and output microwave signals on first, second, third, and fourth outer connection ports (191, 192, 193, 194). In another example embodiment, nested multi-stage polyphase filter 100 can be configured to receive microwave signals at first, second, third, and fourth outer connection ports (191, 192, 193, 194) and output IF signals on first and second inner connection ports (101, 102). In one example embodiment, the center connection ports can be output ports and the outer connection ports can be input ports.

Intermediate Connections:

In one example embodiment, first filter stage 110 can be connected to second filter stage 120 via a first intermediate connection 111, a second intermediate connection 112, a third intermediate connection 113, and a fourth intermediate connection 114. In an example embodiment, the first, second, third, and fourth intermediate connections (111, 112, 113, 114 or in FIGS. 2—211, 212, 213, 214) can be located between first filter stage (110, 210) and second filter stage (120, 220) and connect the two stages. In an example embodiment, sets of intermediate connections can be provided between each filter stage and the next most outer filter stage.

In an example embodiment, each of second through Nth filter stages can include inner intermediate connection ports and an outer intermediate connection ports. Moreover, the first filter stage can also include outer intermediate connection ports. It is noted that the first filter stage can include inner connection ports that can be considered the center connection ports (201, 202). In one example, with reference to FIG. 2, second filter stage 220 can include four inner intermediate connection ports (e.g., inner intermediate connection port 251) and four outer intermediate connection ports (e.g., outer intermediate connection port 252). In this example embodiment, the outer connection port 242 of first filter stage 210 can be connected to the inner intermediate connection port 251 of second filter stage 220 via first intermediate connection 211. Similarly, the outer intermediate connection port 252 of second filter stage 220 can be connected to the inner intermediate connection port 261 of third filter stage 230 via an intermediate connection. Thus, in an example embodiment, intermediate connections can be provided between two adjacent nested stages by connecting outer intermediate connection ports of the inner of the two stages to nearby inner intermediate connection ports of the outer of the two stages.

In an example embodiment, each intermediate connection, of the set of intermediate connections defined between a particular stage and the next connected stage, can be of equal length. Thus, for example, the four intermediate connections (211, 212, 213, 214) can be equal in length to each other. This can be true as well for sets of intermediate connections between other stages.

In accordance with various example embodiments, the nested multi-stage polyphase filter 100 can be formed in a planar circuit implementation. For example, the filter can be formed in an IC or PCB, with components located in the same layer. In an example embodiment, nested multi-stage polyphase filter 100 can be formed with first filter stage 110 and second filter stage 120 in the same plane. In another example embodiment, nested multi-stage polyphase filter 100 can be formed with each of the N filter stages located in the same plane.

In other example embodiments, at least one component(s) of nested multi-stage polyphase filter 100 can be located in a different plane than the others. For example, the filter stages can be located in a first plane and the intermediate connections can be located in a second plane. In another example embodiment, each stage can be offset from the next stage by at least one layer(s). This can form a stair step like structure from the inner to the outer phase, with vias utilized with the intermediate connections to connect the stages. Thus, various embodiments can be implemented that have non-planar implementations of the disclosure herein.

In various example embodiments, nested multi-stage polyphase filter 100 can be formed with the intermediate connections all located in the same plane as first filter 110 and second filter 120. In another example embodiment, regardless of the planes of first filter 110 and second filter 120, all connections between the N stages can be located in a single plane. In another example embodiment, regardless of the planes of first filter 110 and second filter 120, nested multi-stage polyphase filter 100 can be configured such that none of the intermediate connection lines cross over each other or cross over a filter stage. In various example embodiments, first intermediate connection 111, second intermediate connection 112, third intermediate connection 113, fourth intermediate connection 114, first filter stage 110, and second filter stage 120 can be all located in a single layer of a semiconductor substrate.

Figure 5:
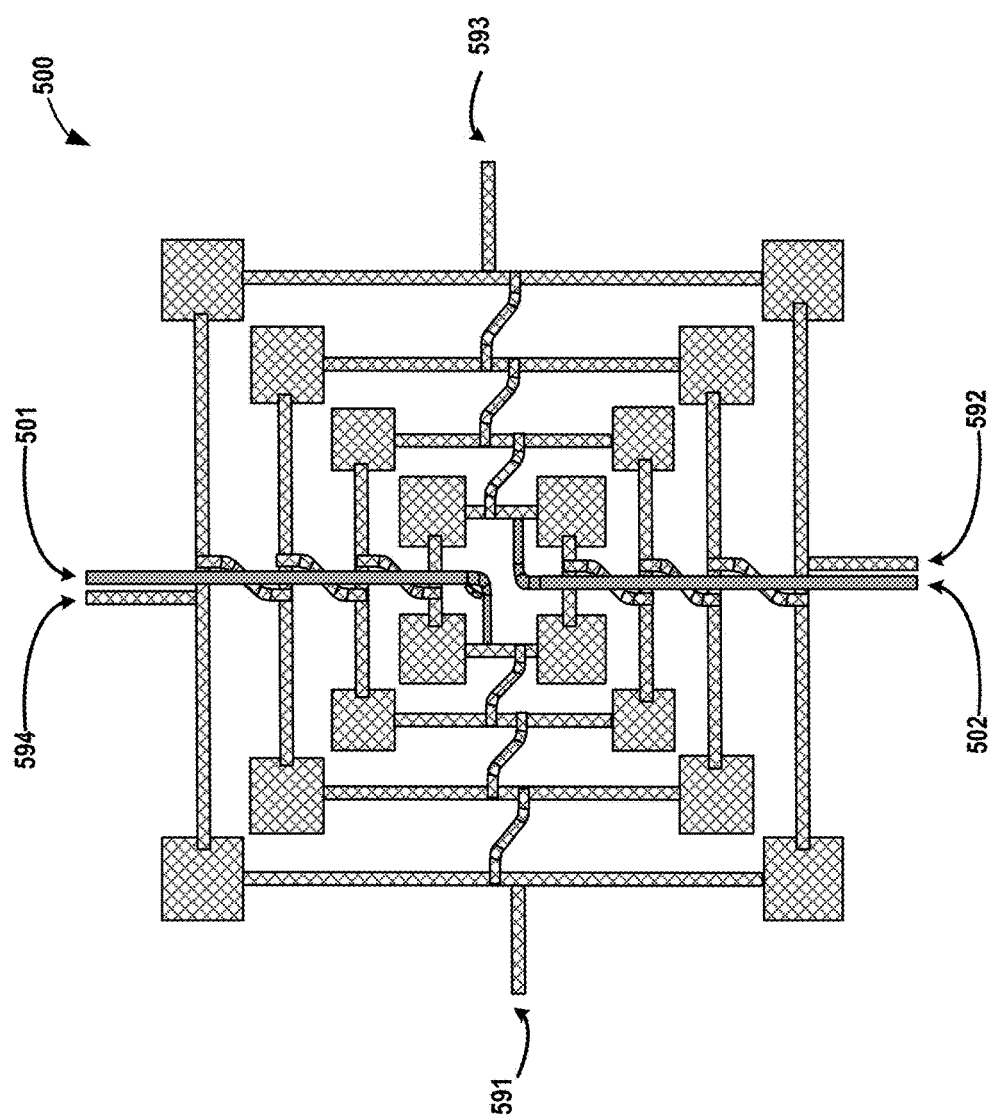
FIGS. 5-7 are schematic diagrams of example nested multi-stage polyphase filters showing various embodiments for connecting signal to the center connection ports.
Figure 6:
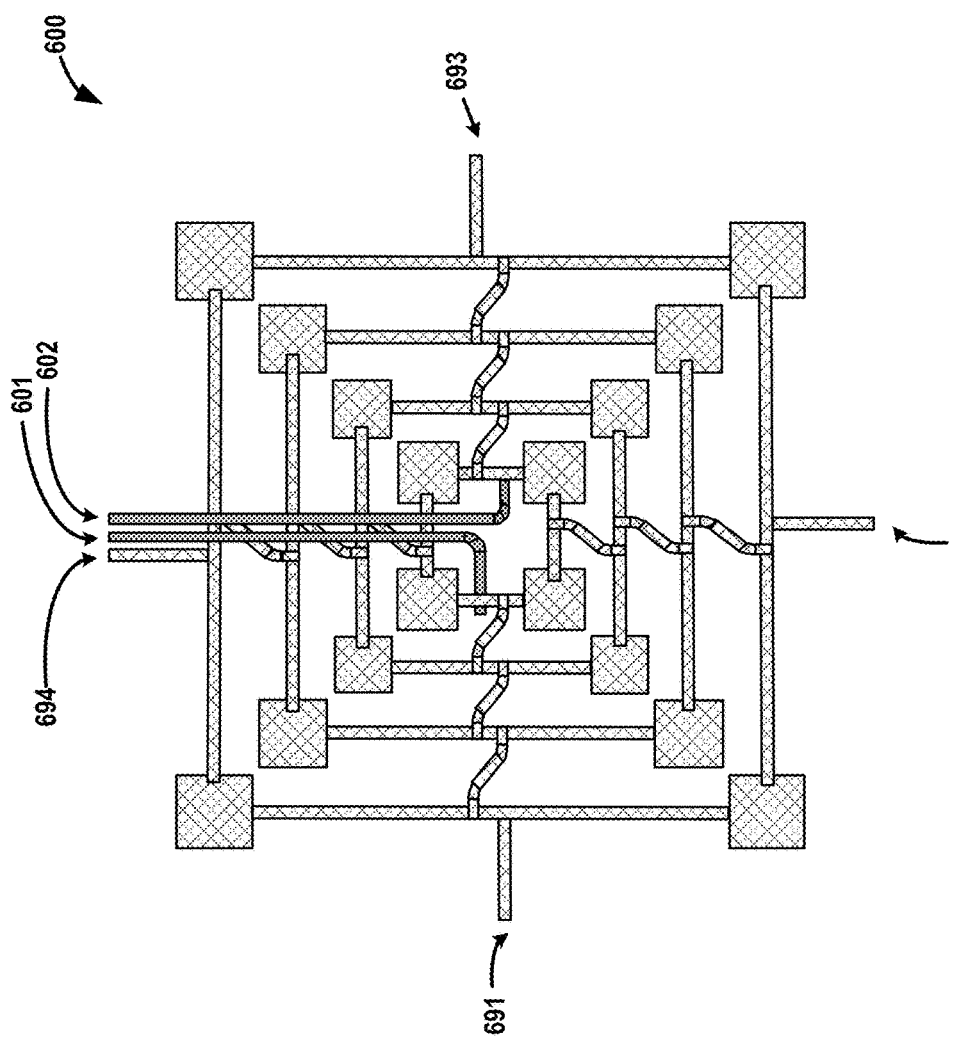

In various example embodiments, the connections to the center connection ports (201, 202) can come in from above or below the plane of the first filter stage. For example, nested multi-stage polyphase filter 100 can be formed with the traces leading to the inner connection ports laid out in a plane above or below the plane of first filter stage 110 and second filter stage 120 to connect the signals to the center connection ports. With reference now to FIGS. 5 and 6, nested multi-stage polyphase filter (500, 600) can include outer connection ports (591, 592, 593, 594/691, 692, 693, 694) and inner connection ports attached to leads (501, 502/601, 602). The leads can be configured to crossover the filter stages to connect the signals to the center of nested multi-stage polyphase filter (500, 600). The crossover can be from above or from below the plane(s) of the filter stages.

In various example embodiments, nested multi-stage polyphase filter 100 can be formed with the traces leading to the outer connection ports all located in the same plane as first filter 110 and second filter 120. However, in other example embodiments, the traces leading to the outer connection ports can be laid out in a plane above or below the filter stages to connect the signals to the outer connection ports.

Figure 7:
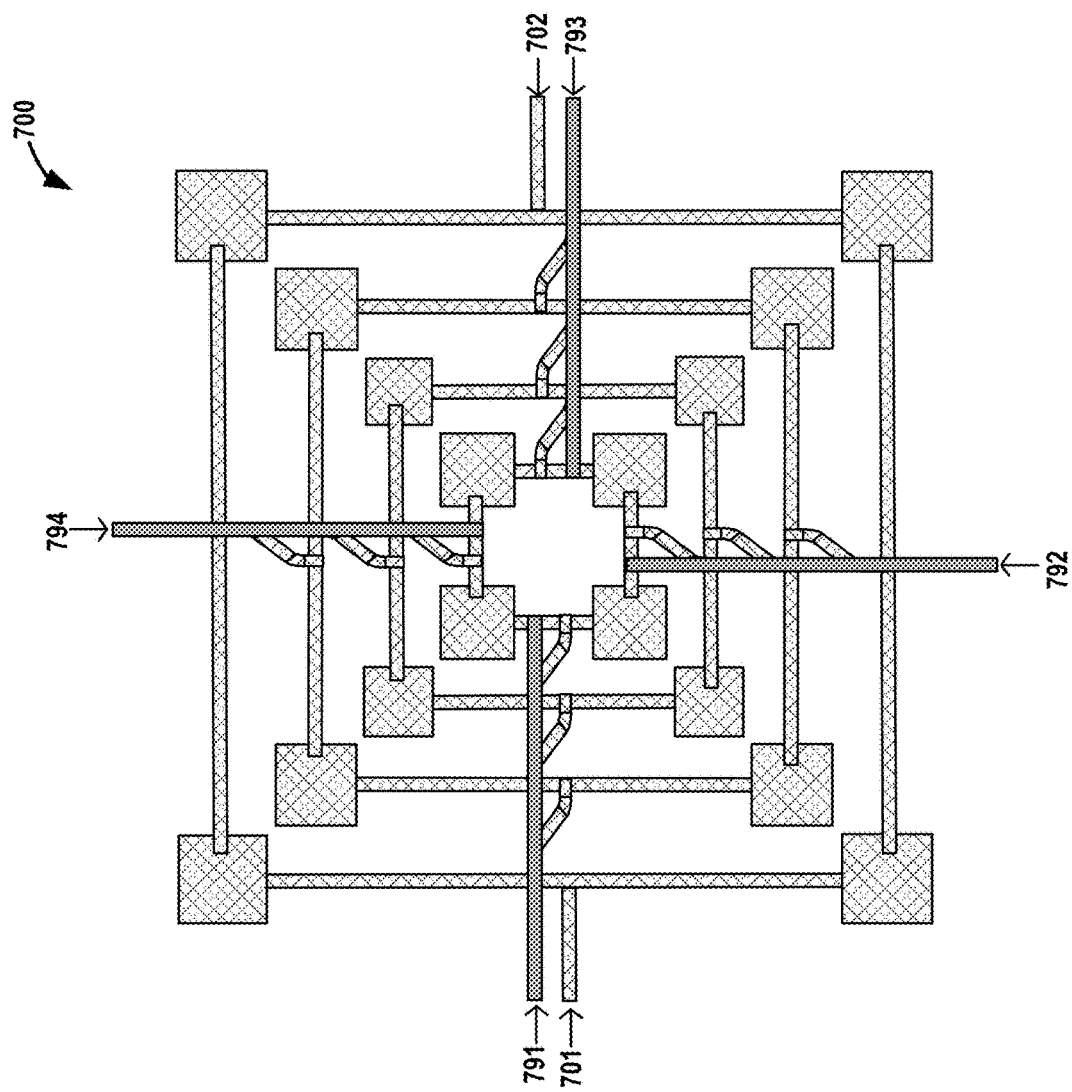

In another example embodiment, and with reference to FIG. 7, nested multi-stage polyphase filter 700 can be formed inside out relative to that disclosed in the previous examples. In this example embodiment, four traces leading to the inner connection ports (791, 792, 793, 794) can be laid out in a plane above or below the same plane as first filter stage 110 and second filter stage 120 to connect the signals to the four inner connection ports. Nested multi-stage polyphase filter 700 can further include outer connection ports (701, 702). The leads attached to the four inner connection ports can be configured to crossover the filter stages to connect the signals to the center of nested multi-stage polyphase filter 700. The crossover can be from above or from below the plane(s) of the filter stages. This embodiment can include symmetry in that each crossover geometry can be symmetric compared with the other three crossover geometries.

Thus, in accordance with example embodiments, nested multi-stage polyphase filter 100 can be configured to include a nested multi-phase filter on a single layer, or with very few layers. For example, nested multi-stage polyphase filter 100 can include a single layer with the exception of the electrical connection to the center input/output ports. In another example embodiment, nested multi-stage polyphase filter 100 can include a single layer (or plane) from the input to the output of nested multi-stage polyphase filter 100.

In accordance with various example embodiments, nested multi-stage polyphase filter 100 can include resistors. In another example embodiment, nested multi-stage polyphase filter 100 can include capacitors. Moreover, nested multi-stage polyphase filter 100 can include a resistor-capacitor (R-C) network. In an example embodiment, nested multi-stage polyphase filter 100 can include inductors or other active or passive components. For example nested multi-stage polyphase filter can include transistors and or the like. In brief, nested multi-stage polyphase filter 100 can include suitable components laid out to form a filter stage. The filter stage can be configured to provide low-pass filtering, high pass filtering, band-pass filtering, or the like.

With reference now to FIG. 2, each filter stage can include M capacitors (labelled "C") and M resistors (labelled "R"). It is noted that although describe herein as a specific number of M capacitors or M resistors, that two or more capacitors in parallel can act as one capacitor of greater value, or two or more resistors in series can act as one resistor of larger capacity. Thus, this disclosure includes such configurations of multiple resistors (capacitors) in speaking of a single resistor (capacitor) that can be part of a set of M resistors (capacitors). In an example embodiment, a resistor R can be located between each pair of capacitors C. In an example embodiment, the value of each capacitor C in the filter stage can be equal to each other. Similarly, the value of each resistor R in the filter stage can be equal to each other. The resistors and capacitors can be connected in a schematic circle alternating between resistors and capacitors.

In an example embodiment, the number M can correspond to the number of outer connection ports. As described herein with reference to FIG. 2, nested multi-stage polyphase filter 200 can include two inputs and four outputs with a 90° phase difference between each of the outputs. Thus, for example, the phases at the four outer connection ports can be, respectively and relatively, 0°, 90°, 180°, and 270°. In other example embodiments, the number of outputs, and the phase difference between the outputs can be different values. In another example embodiment, M can be equal to 360° divided evenly by the phase difference between the signals at the outer connection ports (or output ports). Thus, where the phase difference between the signals at the outer connection ports is 90°, M can be equal to 360°/90°, i.e., four. Viewed from another perspective, where the number of outputs are four, the phase difference between the signals can be equal to 360°/4=90°.

Thus, in an example embodiment, M, the number of outer connection ports, the number of output ports, the number of capacitors, and/or the number of resistors can equal 4, 6, 8, 10, or 2*X, where X can be any positive integer greater than one. Similarly, the phase difference between the phases can be 90°, 60°, 45°, and 360°/(2*X). Thus, where the number of outer connection ports is M, the phase difference between the signals at each outer connection port can be 360°/M. Thus, for example, the phases at six outer connection ports can be, respectively and relatively, 0°, 60°, 120°, 180°, 240°, and 300°. In this regard, each outer connection port can correspond to an intermediate connection between the stages. Thus, the number of intermediate connections between the stages can be equal to the number of outer connection ports.

In typical multi-stage filters, the design cannot be scaled to accommodate an increase in the number M of outputs having differential phases, and particularly not when there is also an increase in the number of stages. In an example embodiment, however, the nested multi-stage polyphase filter 100 can be configured for a scalable design to use the same structure for a filter with a 90 degree phase differential as one with a 60 degree phase differential, and regardless of the number of stages desired.

In one example embodiment, the filter stage can be physically laid out as a square.

With reference to FIG. 2, the filter stages can be physically laid out as a square, with each side (or "section") of the square associated with one of four ports (e.g., outer connection ports 291, 292, 293, 294). In this example embodiment, each of the M capacitors can be separately located at a corner between the adjacent sides of the square. Furthermore, one resistor of the M resistors can be located on each side of the square for that stage. Each resistor can be centered between the two capacitors (i.e., centered on a side).

Stated more generally, in an example embodiment with M connection ports, there can be M sides or sections of the filter stage. Thus, in an example embodiment where M=6, nested multi-stage polyphase filter 100 may be laid out in nested hexagon shaped filter stages. In another example embodiment where M=8, nested multi-stage polyphase filter 100 can be laid out in nested octagon shaped filter stages. Capacitors can be located at the intersection of each section of the square, hexagon, octagon, etc., with resistors located on each side between such capacitors. Accordingly, the number of capacitors can be M and the number of resistors can be M.

Figure 3:
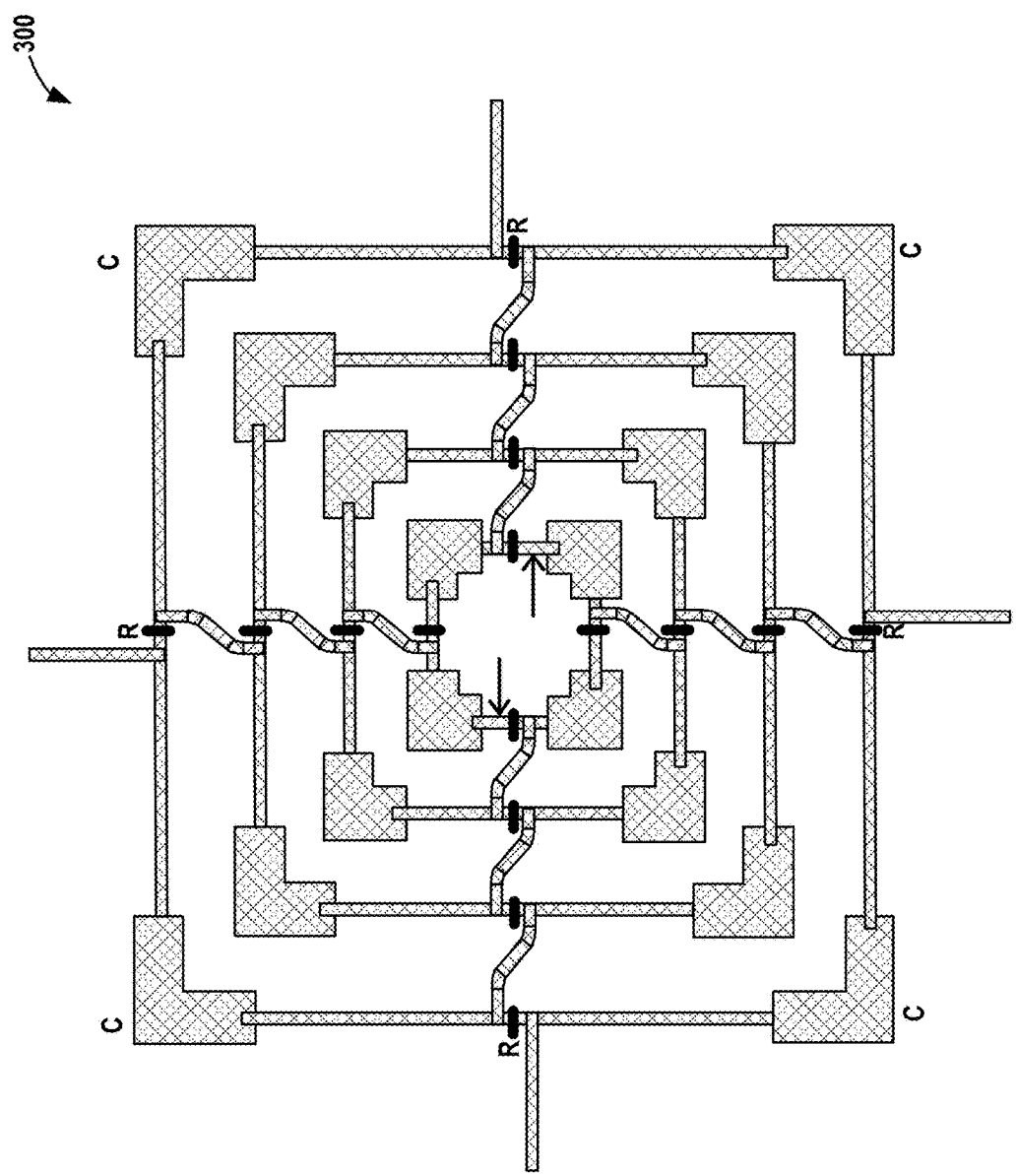
FIG. 3 is another schematic diagram of an example nested multi-stage polyphase filter including "L" shaped capacitors.

The capacitors, for example, can be set in a rectilinear form as illustrated in FIGS. 1 and 2. In another example embodiment, not shown, the capacitors can be rotated on the corners to facilitate a more compact design. In yet another example embodiment, and with momentary reference to FIG. 3, the capacitors of nested multi-stage polyphase filter 300 can be made "L" shaped. The L shape can facilitate a more compact design. Moreover, the physical layout can be a circle, a square with angled corners, or any suitable shape consistent with principle(s) of the present disclosure. In another example embodiment, and with momentary reference to FIG. 4, nested multi-stage polyphase filter 400 can have N-stages and M=6 R-C sections. In this example embodiment, the phase difference between adjacent output ports can be equal to 60°.

In an example embodiment, nested multi-stage polyphase filter 200 includes a first section 281, second section 282, third section 283, and fourth section 284, associated with outer connection ports 291-294, respectively. In one example embodiment, the intermediate connections (e.g., 211-214) can be offsetting connections. In an example embodiment, each side of each filter stage can include an inner connection port and an outer connection port separated by a resistor. Thus, each side of each filter stage can include in sequence: a capacitor, an inner connection port, a resistor, an outer connection port and another capacitor, with the capacitors located on the corners of the side. In one example embodiment, for each section or side of nested multi-stage polyphase filter 200, each resistor of the various filter stages can be aligned. In an example embodiment, the resistors can be aligned along lines of symmetry. For example, the resistors associated with sections 281 and 283 can be aligned with a first line of symmetry 271. Similarly, the resistors associated with sections 282 and 284 can be aligned with a second line of symmetry 272.

Thus, when the various filter stages are connected with intermediate connections connected to the respective outer and inner connections ports, the intermediate connections can be configured with an "S" like shape that offsets the intermediate connection across the first or second line of symmetry.

In an example embodiment, the capacitors of nested multi-stage polyphase filter 200 can be laid out with reflection symmetry about the first and second lines of symmetry. For example, each capacitor in the upper left quadrant can be represented by a minor image of that capacitor reflected across the first and second lines of symmetry (271, 272). Similarly, each resistor has a counterpart resistor reflected across respective first or second lines of symmetry (271, 272). Moreover, the connecting signal pathways between capacitors can be reflection symmetrical across respective first or second lines of symmetry (271, 272) noting the exception related to the intermediate connection and inner/outer connection ports discussed herein.

In addition to the symmetry of the components discussed above, nested multi-stage polyphase filter 200 can be configured to have rotational symmetry with respect to the center connection ports, inner connection ports, outer connection ports, and intermediate connections. For these components, the symmetry can be a rotational symmetry about a point of rotational symmetry 275 and rotated in the plane of nested multi-stage polyphase filter 200. Thus, the first center connection port can be rotationally 180° symmetrical with the second center connection port. In an example embodiment, the inner connection ports, outer connection ports, and intermediate connections can be rotationally symmetrical with their 180° counterparts.

In various example embodiments, therefore, the connections to and between the stages can be balanced. The intermediate connections can be, due to the symmetry, substantially equal in length, shape (bends/geometry), and location in the filter with respect to the other intermediate connections in-between two filter stages. The connections may not be precisely equal due to design constraints, manufacturing accuracy, measurement limitations, and other factors. It is noted that the symmetry further facilitates the output of one stage being close to the input of the next outermost filter stage. In fact, in an example embodiment, the intermediate connections can be configured to be of a minimum length. A balanced, minimum length can refer not only to all such intermediate connections (the same pair of stages) having the same length (stage to stage line lengths), but to where no intermediate connection length was extended to match a longer intermediate connection length. Stated another way, nested multi-stage polyphase filter 200 can be designed without meander lines being used to try to balance the connections.

Figure 4:
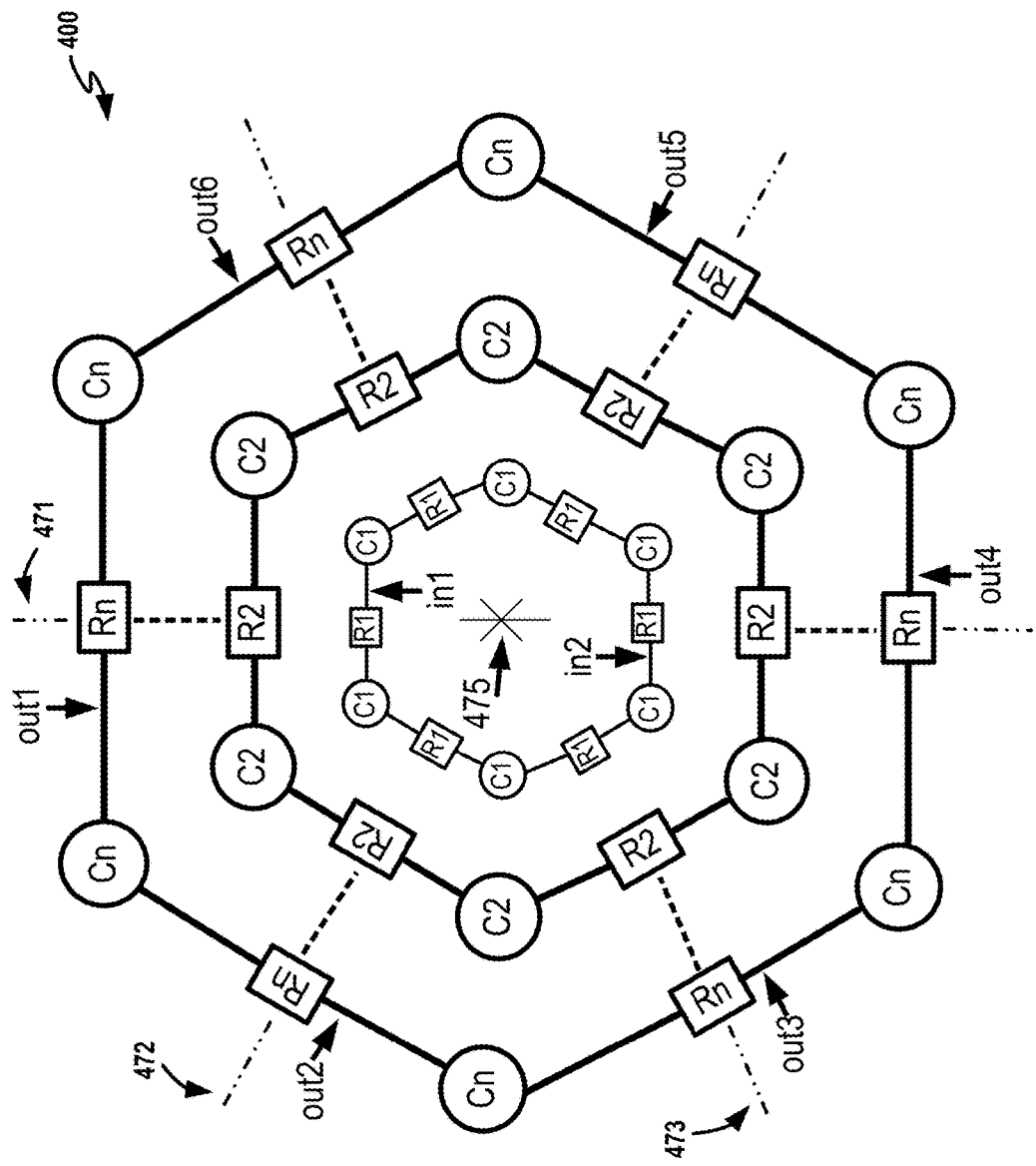
FIG. 4 is a schematic diagram of an example nested multi-stage polyphase filter having N stages and M outputs.

In an example embodiment, the nested multi-stage polyphase filter can include at least two axes of symmetry. In accordance with other example embodiments, where the phase difference between outputs is less than 90°, e.g., 60° or 45°, the number of lines of symmetry can also increase. For example, where M=6, there can be three lines of symmetry, and where M=8, there can be four lines of symmetry. In an example embodiment, there can be M/2 lines of symmetry. With reference now to FIG. 4, an N stage nested multi-stage polyphase filter 400 having M=6 outer connections can include six capacitors and six resistors per stage. Nested multi-stage polyphase filter 400 can include a first line of symmetry 471, a second line of symmetry 472, a third line of symmetry 473, and a point of rotational symmetry 475.

Moreover, symmetry can include a design layout configured such that the amplitude of each output can be equal to the other outputs, and the phase of each output can be substantially separated by the same differential phase angle from one output to the next.

Nested multi-stage polyphase filters, as described herein, can be used in a high bandwidth electronic communication system employing advanced modulation algorithms. Nested multi-stage polyphase filters can also be used in applications where it is desirable to have accurate phase separation between several output ports. For example, nested multi-stage polyphase filters can be beneficially used in modern digital signal modulation applications, high performance mixers, and antenna arrays. In other examples, nested multi-stage polyphase filters can be used in mobile, in-flight, or space born devices where digital/analog modulation schemes are used. In yet further examples, nested multi-stage polyphase filters can be used in IC manufacturing (e.g., using silicon (Si), gallium arsenide (GaAs), gallium nitride (GaN), and other processes). Nested multi-stage polyphase filter 100 can also be used in monolithic microwave integrated circuit (MMIC) designs involving current sharing between phases. Although described herein as a planar circuit, such as in a GaAs integrated circuit, nested multi-stage polyphase filter 100 can be implemented in other embodiments. For example, nested multi-stage polyphase filter 100 can be implemented as a filter with coaxial connectors on the input and/or output. Nested multi-stage polyphase filter 100 can also be used for unwanted signal rejection. If the desired signal and unwanted signal have opposite sequences, the unwanted signal can be rejected by the polyphase filter.

Figure 8:
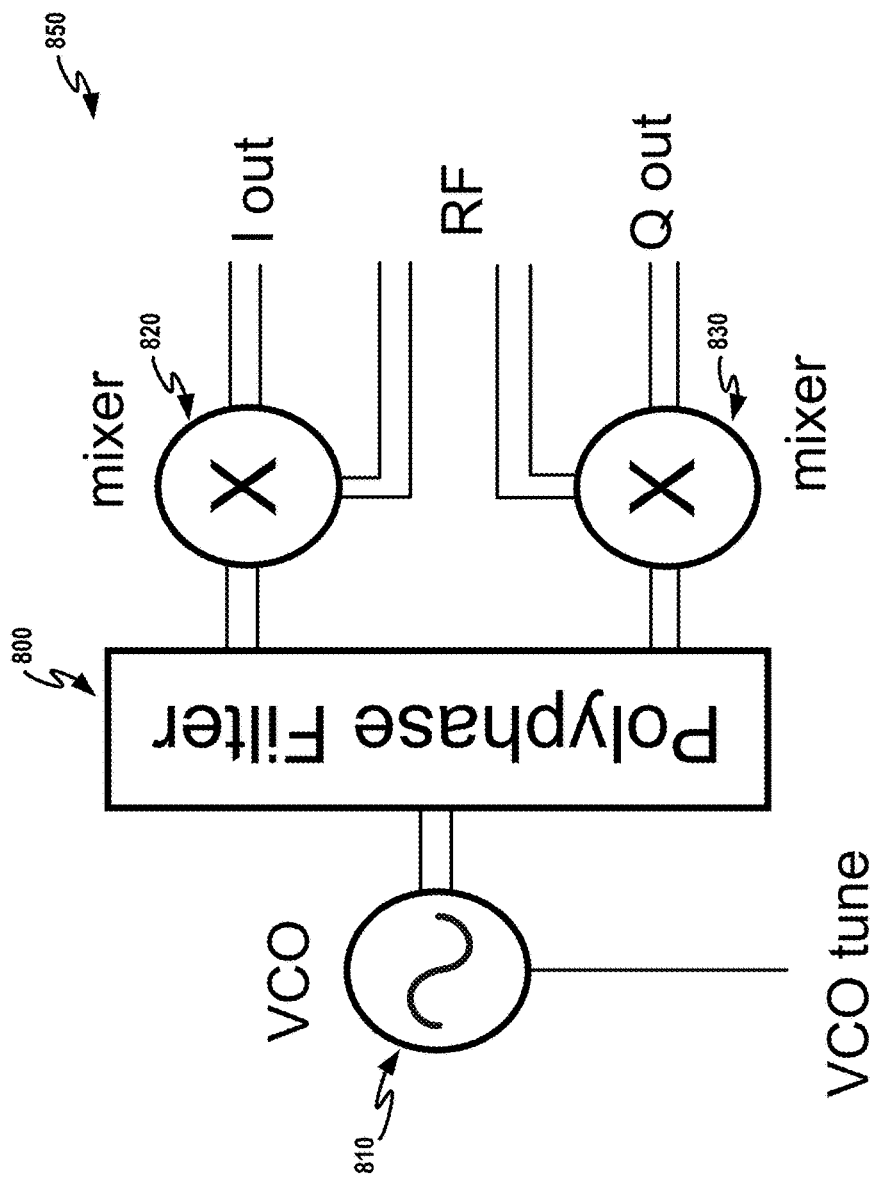
FIG. 8 is a schematic diagram of an example application for an example nested multi-stage polyphase filter.

With reference now to FIG. 8, nested multi-stage polyphase filter 800 (which can be any of the previously described examples of nested polyphase filters) can be used in a digital I/Q mixer 850 for quadrature signal generation. Quadrature signals can be generated from differential signals via the polyphase filter. For example, nested multi-stage polyphase filter 800 can be connected at its connection ports (e.g., center connection ports 101/102) to a voltage controlled oscillator (VCO) 810 via two input traces. Nested multi-stage polyphase filter 800 can be connected at its four connection ports to two mixers (820, 830). For example, two of the outer connection ports can be connected to mixer 820 (e.g., the 0° and 180° outer connection ports), and two of the other outer connection ports can be connected to mixer 830 (e.g., the 90° and 270° outer connection ports).

In accordance with various example embodiments, the symmetry and short line lengths can be configured to minimize undesired electromagnetic (EM) coupling. In an example embodiment, the adjacent output connections can be spaced relatively far apart from each other and (in the embodiment where M=4) the adjacent output connections can be perpendicular to each other. Moreover, the physical nested-ring arrangement can facilitate short line lengths and avoidance of crossover of the intermediate connections. All this can also facilitate a reduction of coupling. In an example embodiment, the intermediate connections between the stages can cause some phase and amplitude adjustment on the signal. Therefore, the nested multi-stage polyphase filter can be configured such that each set of intermediate connections (between two filter stages) can be configured to cause the same phase and amplitude adjustment (relative to each other) to each signal that passes through it.

Nested multi-stage polyphase filters as described herein can be configured to improve filter performance for high bandwidth, high frequency electronic communication systems. High bandwidth can include any bandwidth broader than a few kHz, a few MHz, a few 100 MHz, or a GHz or more. Added stages can facilitate wider bandwidth. High frequency can be radiofrequency microwave frequency signals or higher. For example, high frequency can be any frequencies greater than 3 kHz, a few MHz, a few 100 MHz, a few GHz, or higher.

Figure 9:
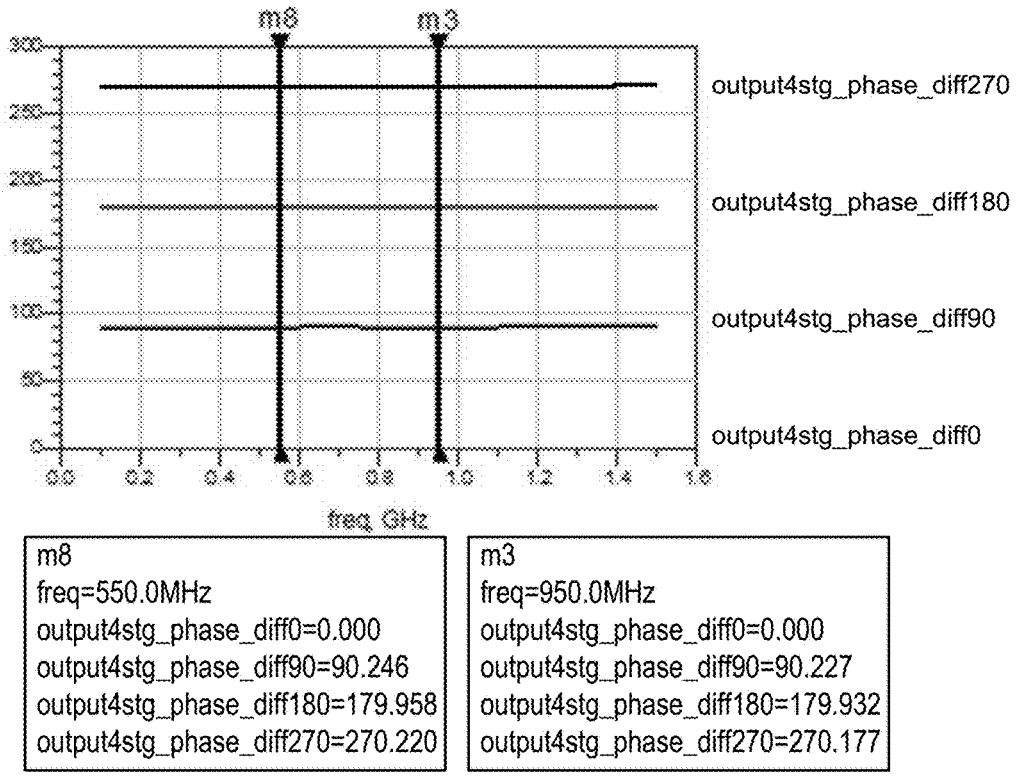
FIGS. 9 and 10 are graphs showing example phase and amplitude differences from ideal conditions for an example nested multi-stage polyphase filter.

In an example embodiment, nested multi-stage polyphase filters can be configured to have close to ideal polyphase filter performance. Stated another way, nested multi-stage polyphase filters can be configured to reduce phase and magnitude imbalances. In an example embodiment, and with reference to FIGS. 9-12, the improvement of the performance of the filter can be significant. FIG. 9 illustrates the phase differential from ideal at each of the four outer connection ports. In an example embodiment, at 500 MHz, the differential from ideal for the 0°, 90°, 180°, and 270° ports can be 0.000°, 90.246°, 179.958°, and 270.220° respectively. At 950.0 MHz, the differential from ideal for the 0°, 90°, 180°, and 270° ports can be 0.000°, 90.227°, 179.932°, and 270.177° respectively. Thus, in this example, the phase differential from ideal can be less than ±0.246°. Compare this to the phase differential from ideal for a conventional filter, whose results are illustrated in FIG. 11. There, the conventional filter can have a phase differential from ideal that can be as big as 2.461°. Thus, nested multi-stage polyphase filter 100 can have an order of magnitude improvement in the phase differential relative to a conventional filer. In an example embodiment, nested multi-stage polyphase filter 100 can be configured to have a phase differential from ideal of less than ±0.5°, ±0.4°, ±0.3°, or ±0.25°. Although various example numbers have been discussed herein for the phase differential from ideal, any suitable phase differential can be within the scope of this disclosure. Thus, in general, nested multi-stage polyphase filters can be configured to have a lower phase deviation than conventional filters.

Figure 10:
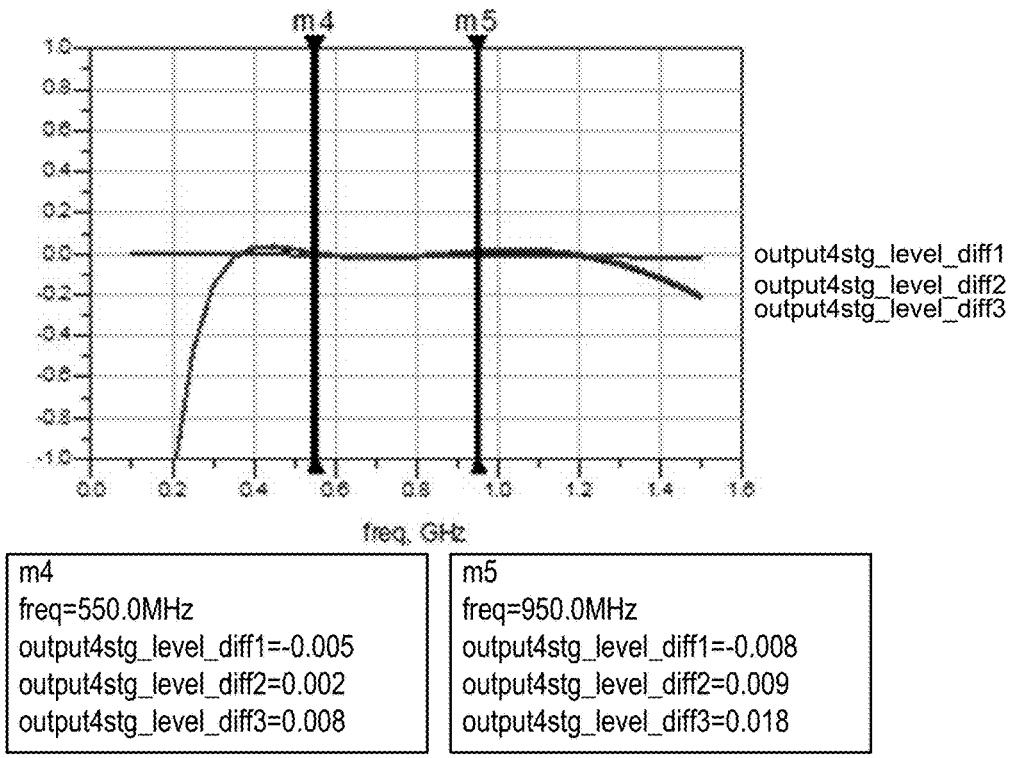
Figure 11:
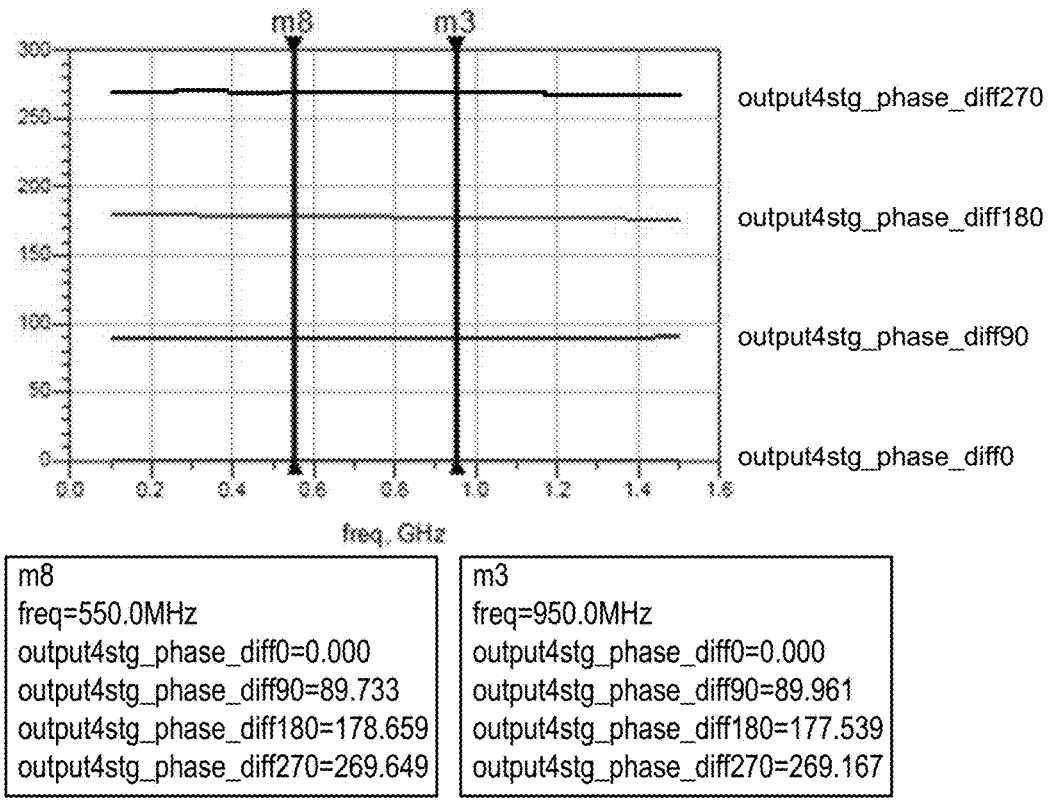
FIGS. 11 and 12 are graphs showing example phase and amplitude differences from ideal conditions in a conventional polyphase filter.
Figure 12:
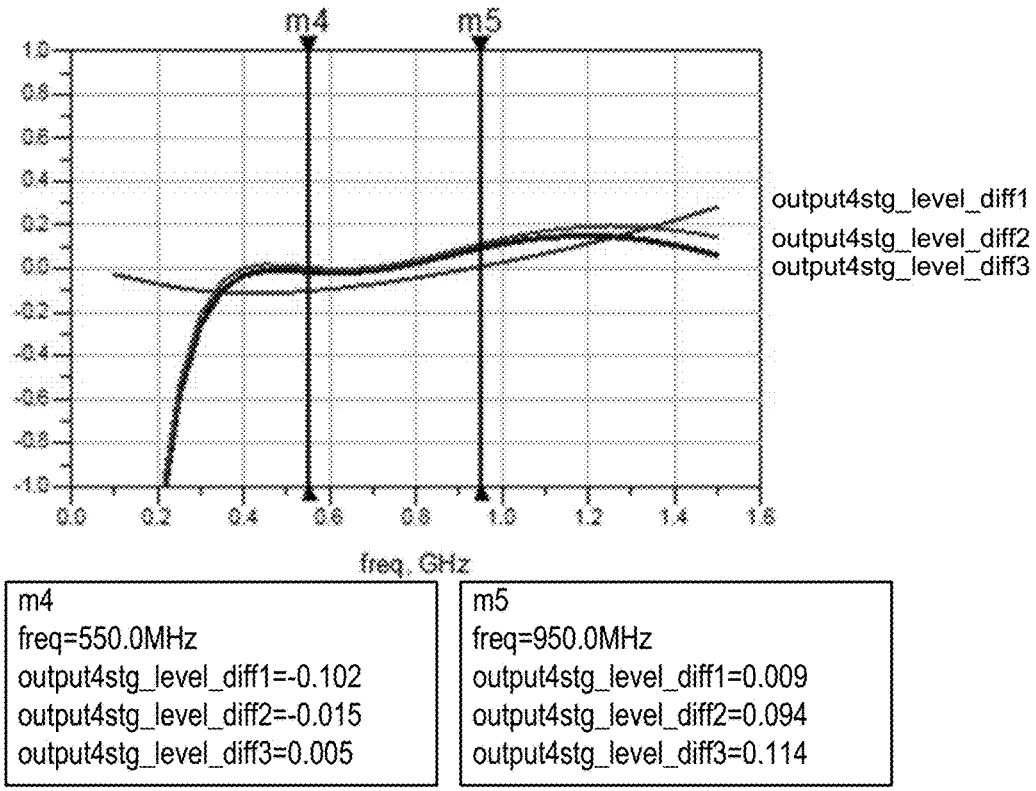

FIG. 10 illustrates the level (amplitude) differential from ideal at each of the four outer connection ports. This was measured by comparing three of the outer connections ports to a fourth outer connection port. In an example embodiment, at 500 MHz, the level differential from ideal for three of the ports can be −0.005, 0.002, and 0.008 dB. At 950.0 MHz, the level differential from ideal for three of the ports can be −0.008, 0.009, and 0.018 dB. Thus, in this example, the level differential from ideal can be less than ±0.018 dB. Compare this to the level differential from ideal for a conventional filter, whose results are illustrated in FIG. 12. There, the conventional filter can have a level differential from ideal that can be as big as ±0.114 dB. Thus, nested multi-stage polyphase filter 100 can have an order of magnitude improvement in the level differential relative to a conventional filter. In an example embodiment, nested multi-stage polyphase filter 100 can be configured to have a level differential from ideal of less than ±0.06, ±0.04, ±0.2, or ±0.018 dB.

Thus, nested multi-stage polyphase filters can, if desired, be configured to have relatively substantial improvement over the performance of conventional filters. Moreover, the filter performance (amplitude and balance) can be relatively flat over a broad bandwidth. Therefore the filter can be less likely to fall out of specifications when operated over a large bandwidth. Such results are difficult to achieve in conventional linear filters.

In an example embodiment, the nested multi-stage polyphase filter can be small. For example, in a semiconductor process using photolithographic technology, the size can be from 0.01 mm to a few square millimeters. In another example, in a printed circuit board, the size can be from a few to hundreds of square millimeters. Moreover, the filter can be any suitable size, and can, in some embodiments, be smaller than devices of similar capability that are not configured to be nested multi-stage polyphase filters.

Figure 14:
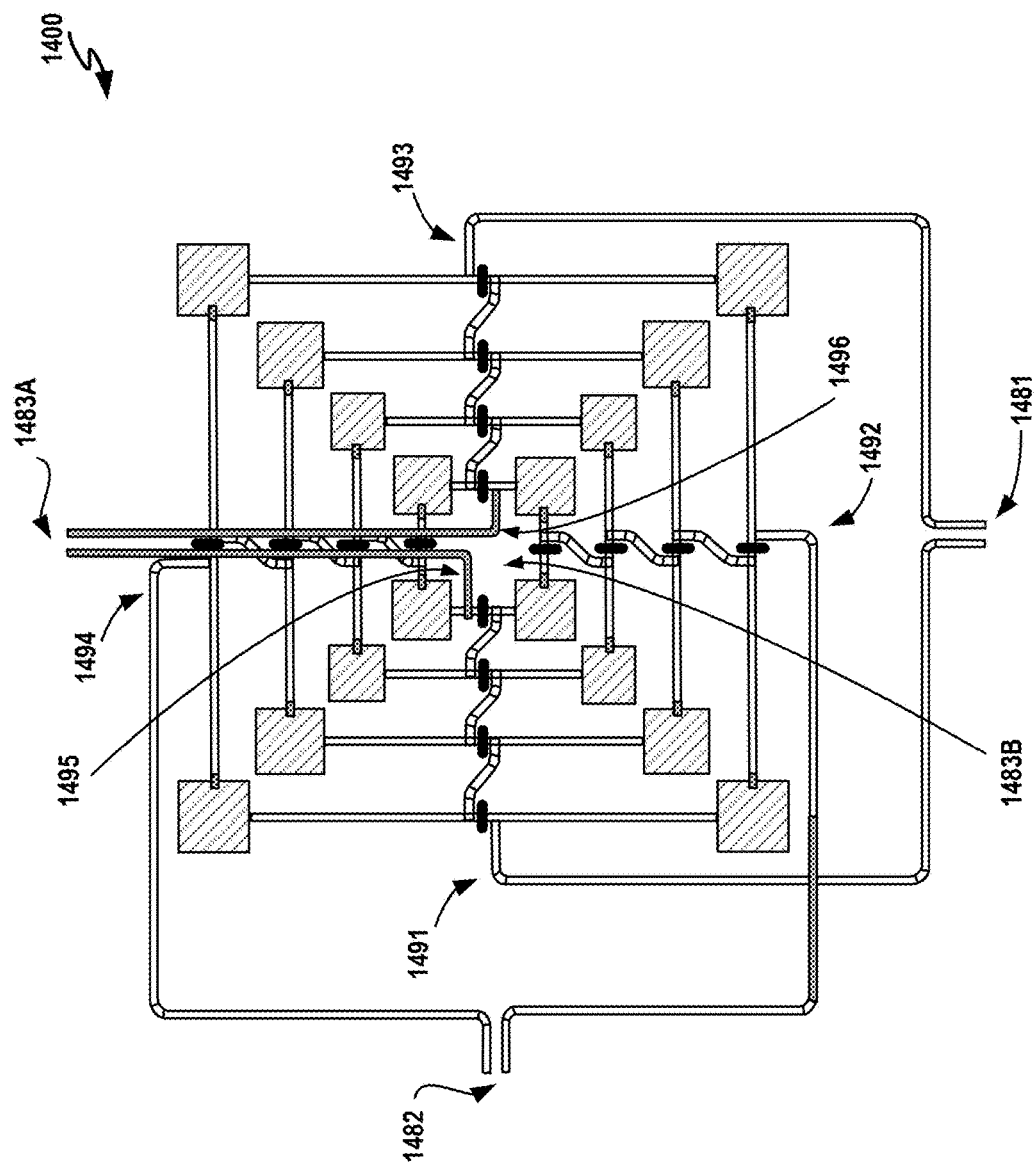
FIG. 14 is a schematic diagram of an example nested multi-stage polyphase filter with its outputs connected as differential pairs at the next level of circuit connection.

In an example embodiment, at the next higher level of integration from the polyphase filter, the ports can be laid out and connected as needed. In an example embodiment, the ports can be brought together as differential pairs. With reference to FIG. 14, nested multi-stage polyphase filter 1400 can include ports 1491, 1492, 1493, and 1494. Ports 1491 and 1493 can be brought in proximity to each other as a first differential pair 1481. Ports 1492 and 1494 can be brought in proximity to each other as a second differential pair 1482. Moreover, ports 1495 and 1496 can be brought in proximity to each other and, in one example embodiment, to external connection as a third differential pair 1483A leading to a side of the filter or, in another example embodiment, to internal connection 1483B at the center of the filter. The embodiment associated with third differential pair 1483A can be used for connections to other circuit(s) on the same plane as the nested ring filter. For vertical connection perpendicular to the filter plane, the embodiment associated with third differential pair 1483B can be used to connect directly from the top or the bottom side of the filter. This vertical embodiment can be useful to avoid crossing over the filter stages. In this example embodiment, the layout of the electrical connections to the first differential pair 1481 and the layout of the electrical connections to the second differential pair 1482 can be rotationally symmetric about a center of filter 1400, and 90° rotated from each other. In this manner, phase and amplitude balances can be maintained in each port pair. However, any suitable layouts can be used at the next higher level of integration.

In describing embodiments of the present invention, the following terminology has been used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

It should be appreciated that the particular implementations shown and described herein are illustrative of the invention and its best mode and are not intended to otherwise limit the scope of the present invention in any way. Furthermore, the connecting lines shown in the various figures contained herein are intended to represent example functional relationships and/or physical couplings between the various elements. It should be noted that many alternative or additional functional relationships or physical connections may be present in a practical device.

It should be understood, however, that the detailed description and specific examples, while indicating example embodiments of the present invention, are given for purposes of illustration only and not of limitation. Many changes and modifications within the scope of the instant invention may be made without departing from the spirit thereof, and the invention includes all such modifications. The corresponding structures, materials, acts, and equivalents of all elements in the claims below are intended to include any structure, material, or acts for performing the functions in combination with other claimed elements as specifically claimed. The scope of the invention should be determined by the appended claims and their legal equivalents, rather than by the examples given above. For example, the operations recited in any method claims may be executed in any order and are not limited to the order presented in the claims. Moreover, no element is essential to the practice of the invention unless specifically described herein as "critical" or "essential."

What is claimed is:

1. A nested multi-stage polyphase filter comprising:
   a first filter stage and a second filter stage;
   input ports connected to one of the first filter stage and the second filter stage; and
   output ports connected to the other of the first filter stage and the second filter stage, wherein the number of input ports is not equal to the number of output ports;
   wherein the first filter stage is connected to the second filter stage via intermediate connections, wherein the intermediate connections comprise a first intermediate connection, a second intermediate connection, a third intermediate connection and a fourth intermediate connection;
   wherein the first filter stage and the second filter stage are laid out in a nested-ring layout; and
   wherein the first intermediate connection, the second intermediate connection, the third intermediate connection, and the fourth intermediate connection do not cross over each other.

2. The nested multi-stage polyphase filter of claim 1, wherein the first intermediate connection and third intermediate connection are 180° rotation symmetrical about a point of rotational symmetry;
   wherein the second intermediate connection and the fourth intermediate connection are 180° rotation symmetrical about the point of rotational symmetry; and
   wherein the first filter stage and the second filter stage are all located in the same layer as the first intermediate connection, the second intermediate connection, the third intermediate connection, and the fourth intermediate connection.

3. The nested multi-stage polyphase filter of claim 2, further comprising M capacitors and M resistors, wherein M is a an integer equal to at least four.

4. The nested multi-stage polyphase filter of claim 3, wherein M=four, wherein a first line of symmetry is perpendicular to a second line of symmetry and intersect at the point of rotational symmetry, wherein the M capacitors are reflection symmetrical about the first line of symmetry and the second line of symmetry, and wherein the M resistors are reflection symmetrical with each other about one of the first line of symmetry or the second line of symmetry.

5. The nested multi-stage polyphase filter of claim 4, wherein the first line of symmetry and the second line of symmetry are in the same layer as the first, second, third, and fourth intermediate connections, and are in the same layer as the intersection of the first and second lines of symmetry, and wherein the intersection of the first and second lines of symmetry is at the center of the nested multi-stage polyphase filter.

6. The nested multi-stage polyphase filter of claim 3, wherein M=six, wherein the first filter stage is further connected to the second filter stage via a fifth intermediate connection, and a sixth intermediate connection, and wherein the fifth intermediate connection and sixth intermediate connection are 180° rotation symmetrical about the point of rotational symmetry, wherein a first line of symmetry, a second line of symmetry, and a third line of symmetry intersect at the point of rotational symmetry, and wherein the intersection forms a 60° acute angle between the first and second lines of symmetry, the second and third lines of symmetry, and the first and third lines of symmetry.

7. The nested multi-stage polyphase filter of claim 6, wherein the first line of symmetry, the second line of symmetry, and the third line of symmetry are in the same layer as the first, second, third, fourth, fifth, and sixth intermediate connections, and are in the same layer as the intersection of the first, second, and third lines of symmetry, and wherein the intersection of the first, second, and third lines of symmetry are at the center of the nested multi-stage polyphase filter.

8. The nested multi-stage polyphase filter claim 1, further comprising:
   center connection ports, comprising a first center connection port and a second center connection port; and
   outer connection ports, comprising a first outer connection port, a second outer connection port, a third outer connection port, and a fourth outer connection port;
   wherein one of: (i) the center connection ports are the input ports and the outer connection ports are the output ports; and (ii) the center connection ports are the output ports and the outer connection ports are the input ports;
   wherein the first filter stage is configured in a ring and located between the center connection ports and the intermediate connections; and
   wherein the second filter stage is configured in a ring and located between the intermediate connections and the outer connection ports.

9. A nested multi-stage polyphase filter comprising:
   center connection ports, comprising a first center connection port and a second center connection port;
   intermediate connections, comprising a first intermediate connection; a second intermediate connection; a third intermediate connection; and a fourth intermediate connection; and
   outer connection ports, comprising a first outer connection port, a second outer connection port, a third outer connection port, and a fourth outer connection port;
   a first filter stage, wherein the first filter stage is configured in a first ring and located between the center connection ports and the intermediate connections; and
   a second filter stage, wherein the second filter stage is configured in a second ring and located between the intermediate connections and the outer connection ports;
   wherein one of: (i) the center connection ports are input ports and the outer connection ports are output ports; and (ii) the center connection ports are output ports and the outer connection ports are input ports; and
   wherein the nested multi-stage polyphase filter comprises more than one line of symmetry.

10. The nested multi-stage polyphase filter of claim 9, wherein the center connection ports are 180° rotation symmetrical about a point of rotational symmetry defined by an intersection of a first line of symmetry and a second line of symmetry, wherein the first and second lines of symmetry are perpendicular to each other and lie in a plane comprising the nested multi-stage polyphase filter;
  wherein the intermediate connections are 180° rotation symmetrical about the point of rotational symmetry;
  wherein the outer connection ports are 180° rotation symmetrical about the point of rotational symmetry;
  wherein components of the first filter stage are reflection symmetrical about the first line of symmetry and the second line of symmetry, wherein the components of the first filter stage comprise at least a first resistor or a first capacitor; and
  wherein components of the second filter stage are symmetrical about the first line of symmetry and the second line of symmetry, wherein the components of the second filter stage comprise at least a second resistor or a second capacitor.

11. The nested multi-stage polyphase filter of claim 9, wherein the first filter stage, second filter stage, and intermediate connections there-between are all located in a same substrate plane.

12. The nested multi-stage polyphase filter of claim 9, wherein the first ring of the first filter stage comprises alternating first resistors and first capacitors and wherein the second ring of the second filter stage comprises alternating second resistors and second capacitors.

13. The nested multi-stage polyphase filter of claim 9, wherein the first intermediate connection is connected to the second filter stage at a first inner intermediate connection port, wherein a first resistor of the second filter stage is connected between the first inner intermediate connection port and a first outer intermediate connection port;
  wherein the second intermediate connection is connected to the second filter stage at a second inner intermediate connection port, wherein a second resistor of the second filter stage is connected between the second inner intermediate connection port and a second outer intermediate connection port;
  wherein the third intermediate connection is connected to the second filter stage at a third inner intermediate connection port, wherein a third resistor of the second filter stage is connected between the third inner intermediate connection port and a third outer intermediate connection port; and
  wherein the fourth intermediate connection is connected to the second filter stage at a fourth inner intermediate connection port, wherein a fourth resistor of the second filter stage is connected between the fourth inner intermediate connection port and a fourth outer intermediate connection port;
  wherein a first capacitor of the second filter stage is connected between the first outer intermediate connection port and the second inner intermediate connection port;
  wherein a second capacitor of the second filter stage is connected between the second outer intermediate connection port and the third inner intermediate connection port;
  wherein a third capacitor of the second filter stage is connected between the third outer intermediate connection port and the fourth inner intermediate connection port; and
  wherein a fourth capacitor of the second filter stage is connected between the fourth outer intermediate connection port and the first inner intermediate connection port.

14. The nested multi-stage polyphase filter of claim 9, wherein the intermediate connections further comprise fifth through Mth intermediate connections, wherein M is an even integer greater than 4; and
  wherein the outer connection ports further comprise fifth through Mth outer connection ports.

15. The nested multi-stage polyphase filter of claim 14, wherein the first intermediate connection is connected to the second filter stage at a first inner intermediate connection port, wherein a first resistor of the second filter stage is connected between the first inner intermediate connection port and a first outer intermediate connection port;
  wherein the second intermediate connection is connected to the second filter stage at a second inner intermediate connection port, wherein a second resistor of the second filter stage is connected between the second inner intermediate connection port and a second outer intermediate connection port;
  wherein the third intermediate connection is connected to the second filter stage at a third inner intermediate connection port, wherein a third resistor of the second filter stage is connected between the third inner intermediate connection port and a third outer intermediate connection port; and
  wherein the fourth intermediate connection is connected to the second filter stage at a fourth inner intermediate connection port, wherein a fourth resistor of the second filter stage is connected between the fourth inner intermediate connection port and a fourth outer intermediate connection port;
  wherein the Mth intermediate connection is connected to the second filter stage at an Mth inner intermediate connection port, wherein an Mth resistor of the second filter stage is connected between the Mth inner intermediate connection port and an Mth outer intermediate connection port;
  wherein a first capacitor of the second filter stage is connected between the first outer intermediate connection port and the second inner intermediate connection port;
  wherein a second capacitor of the second filter stage is connected between the second outer intermediate connection port and the third inner intermediate connection port;
  wherein a third capacitor of the second filter stage is connected between the third outer intermediate connection port and the fourth inner intermediate connection port;
  wherein a fourth capacitor of the second filter stage is connected between the fourth outer intermediate connection port and a fifth inner intermediate connection port; and
  wherein an Mth capacitor of the second filter stage is connected between the Mth outer intermediate connection port and the first inner intermediate connection port.

16. The nested multi-stage polyphase filter of claim 9, further comprising an Nth filter stage, wherein N is a positive integer greater than two; and
  wherein the Nth filter stage is configured in a ring and located between the second filter stage and the outer connection ports.

17. The nested multi-stage polyphase filter of claim 9, wherein the first ring of the first filter stage further comprises: a first capacitor, a second capacitor, a third capacitor, a fourth capacitor, a first resistor, a second resistor, a third resistor, and a fourth resistor that are all arranged alternatingly in a ring structure;
- wherein the first center connection port is connected to the first filter stage in-between the fourth capacitor and the first resistor;
- wherein the second center connection port is connected to the first filter stage in-between the second capacitor and the third resistor;
- wherein the first intermediate connection is connected to the first filter stage in-between the first resistor and the first capacitor;
- wherein the second intermediate connection is connected to the first filter stage in-between the second resistor and the second capacitor;
- wherein the third intermediate connection is connected to the first filter stage in-between the third resistor and the third capacitor; and
- wherein the fourth intermediate connection is connected to the first filter stage in-between the fourth resistor and the fourth capacitor.

18. The nested multi-stage polyphase filter of claim 17, wherein the first resistor is connected to the first capacitor, wherein the first capacitor is connected to the second resistor;
- wherein the second resistor is connected to the second capacitor, wherein the second capacitor is connected to the third resistor;
- wherein the third resistor is connected to the third capacitor, wherein the third capacitor is connected to the fourth resistor; and
- wherein the fourth resistor is connected to the fourth capacitor, and wherein the fourth capacitor is connected to the first resistor.

19. The nested multi-stage polyphase filter of claim 18, wherein the first center connection port is most nearly connected to the first intermediate connection via the first resistor;
- wherein the first center connection port is most nearly connected to the fourth intermediate connection via the fourth capacitor;
- wherein the second center connection port is most nearly connected to the third intermediate connection via the third resistor; and
- wherein the second center connection port is most nearly connected to the second intermediate connection via the second capacitor.

20. The nested multi-stage polyphase filter of claim 17, wherein the second filter stage comprises: a fifth capacitor, a sixth capacitor, a seventh capacitor, an eighth capacitor, a fifth resistor, a sixth resistor, a seventh resistor, and an eighth resistor that are all arranged alternatingly in a ring structure;
- wherein the first intermediate connection is connected to the second filter stage in-between the fifth resistor and the eighth capacitor;
- wherein the second intermediate connection is connected to the second filter stage in-between the sixth resistor and the fifth capacitor;
- wherein the third intermediate connection is connected to the second filter stage in-between the seventh resistor and the sixth capacitor;
- wherein the fourth intermediate connection is connected to the second filter stage in-between the eighth resistor and the seventh capacitor;
- wherein the first outer connection port is connected to the second filter stage in-between the fifth resistor and the fifth capacitor;
- wherein the second outer connection port is connected to the second filter stage in-between the sixth resistor and the sixth capacitor;
- wherein the third outer connection port is connected to the second filter stage in-between the seventh resistor and the seventh capacitor; and
- wherein the fourth outer connection port is connected to the second filter stage in-between the eighth resistor and the eighth capacitor.

\* \* \* \* \*